(12) United States Patent
Horak et al.

(10) Patent No.: US 9,349,598 B2
(45) Date of Patent: May 24, 2016

(54) GATE CONTACT WITH VERTICAL ISOLATION FROM SOURCE-DRAIN

(71) Applicants: International Business Machines Corporation, Armonk, NY (US); GLOBALFOUNDRIES Inc., Grand Cayman (KY)

(72) Inventors: David V. Horak, Essex Junction, VT (US); Shom S. Ponoth, Gaithersburg, MD (US); Balasubramanian Pranatharthiharan, Watervliet, NY (US); Ruilong Xie, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/832,530

(22) Filed: Aug. 21, 2015

(65) Prior Publication Data

US 2015/0357409 A1 Dec. 10, 2015

Related U.S. Application Data

(62) Division of application No. 14/161,724, filed on Jan. 23, 2014, now Pat. No. 9,147,576.

(51) Int. Cl.
*H01L 21/28* (2006.01)
*H01L 29/06* (2006.01)
*H01L 29/417* (2006.01)
*H01L 29/51* (2006.01)

(Continued)

(52) U.S. Cl.
CPC ...... *H01L 21/28008* (2013.01); *H01L 29/0649* (2013.01); *H01L 29/41783* (2013.01); *H01L 29/4232* (2013.01); *H01L 29/42376* (2013.01); *H01L 29/495* (2013.01); *H01L 29/4966* (2013.01); *H01L 29/51* (2013.01); *H01L 29/517* (2013.01); *H01L 29/6653* (2013.01); *H01L 29/66545* (2013.01); *H01L 29/66628* (2013.01)

(58) Field of Classification Search
CPC ............... H01L 21/76819; H01L 21/76829; H01L 21/76832; H01L 21/76897
See application file for complete search history.

(56) References Cited

U.S. PATENT DOCUMENTS

| 5,770,097 A | 6/1998 | O'Neill et al. |
| 6,448,140 B1 * | 9/2002 | Liaw ............ H01L 21/28114 257/E21.2 |

(Continued)

*Primary Examiner* — Kyoung Lee
(74) *Attorney, Agent, or Firm* — Scully, Scott, Murphy & Presser, P.C.; Bryan Bortnick, Esq.

(57) ABSTRACT

A method of forming a semiconductor structure includes forming a gate structure having a first conductive material above a semiconductor substrate, gate spacers on opposing sides of the first conductive material, and a first interlevel dielectric (ILD) layer surrounding the gate spacers and the first conductive material. An upper portion of the first conductive material is recessed. The gate spacers are recessed until a height of the gate spacers is less than a height of the gate structure. An isolation liner is deposited above the gate spacers and the first conductive material. A portion of the isolation liner is removed so that a top surface of the first conductive material is exposed. A second conductive material is deposited in a contact hole created above the first conductive material and the gate spacers to form a gate contact.

18 Claims, 10 Drawing Sheets

(51) Int. Cl.
*H01L 29/49* (2006.01)
*H01L 29/423* (2006.01)
*H01L 29/66* (2006.01)

(56) References Cited

U.S. PATENT DOCUMENTS

| | | |
|---|---|---|
| 6,731,008 B1 | 5/2004 | Tomita et al. |
| 6,890,815 B2 | 5/2005 | Faltermeier et al. |
| 7,078,282 B2 | 7/2006 | Chau et al. |
| 7,867,912 B2 | 1/2011 | Caspary et al. |
| 8,034,722 B2 | 10/2011 | Lin et al. |
| 8,043,922 B2 | 10/2011 | Lee et al. |
| 8,309,460 B2 | 11/2012 | Kim et al. |
| 2006/0237804 A1 | 10/2006 | Chau et al. |
| 2012/0119307 A1* | 5/2012 | Li ............ H01L 21/76832 257/410 |

* cited by examiner

GATE CONTACT WITH VERTICAL ISOLATION FROM SOURCE-DRAIN

BACKGROUND

The present invention generally relates to integrated circuits, and more particularly to fabricating semiconductor structures having gate contacts electrically isolated from source-drain regions.

Contacts may be formed in order to make electrical connections to a semiconductor device. Contacts to source-drain regions of the semiconductor device may be referred to as CA contacts. CA contacts may be distinguished from CB contacts which may form an electrical connection to the gate of a semiconductor structure. The source-drain regions may remain electrically insulated from the gate terminal in order to improve functionality of the semiconductor device. Additionally, a short circuit between the source-drain regions and the gate may damage the semiconductor device. CA and CB contacts may be formed in a contact hole etched in an interlevel dielectric (ILD) layer deposited over the semiconductor device, and therefore may be surrounded by the ILD layer. As a result of device scaling, CB contacts may be placed in increasingly close proximity to the source-drain regions, thus raising the possibilities of having a short circuit between the CB contact and an adjacent source-drain region.

SUMMARY

The ability to manufacture semiconductor structures including gate contacts electrically isolated from source-drain regions may facilitate advancing the capabilities of current complementary metal-oxide-semiconductor (CMOS) technology.

According to an embodiment of the present disclosure, a method of forming a semiconductor structure may include: forming a gate structure including a first conductive material above a semiconductor substrate, gate spacers on opposing sides of the first conductive material, and a first interlevel dielectric (ILD) layer surrounding the gate spacers and the first conductive material. An upper portion of the first conductive material may be recessed. The gate spacers may be recessed until a height of the gate spacers is less than a height of the gate structure. An isolation liner may be deposited above the gate spacers and the first conductive material. A portion of the isolation liner may be removed so that a top surface of the first conductive material is exposed and a second conductive material may be deposited in a contact hole created above the first conductive material and the gate spacers to form a gate contact.

According to another embodiment of the present disclosure, a method may include forming a semiconductor structure above a semiconductor substrate. The semiconductor structure may include a gate structure having a first conductive material and a workfunction metal, gate spacers located on opposite sides of sidewalls of the gate structure, and a source-drain region adjacent to the gate spacers. A first ILD layer may be deposited above the semiconductor substrate. A portion of the first conductive material may be etched. The gate spacers may be etched to form a recess above the gate spacers at a level below the first conductive material. An isolation liner may be formed in the recess. The isolation liner may be etched to expose a top surface of the first conductive material. The gate spacers may remain covered by the isolation liner and a gate cap is formed above the isolation liner and the first conductive material.

According to another embodiment of the present disclosure, a semiconductor structure may include: gate spacers located on opposite sides of a gate structure on a semiconductor substrate, the gate structure may have a height greater than a height of the gate spacers. An ILD layer above the semiconductor substrate, an isolation liner above the gate spacers, the isolation liner may be located between a first conductive material of the gate structure and an exposed sidewall of the ILD layer, and a gate contact electrically connected to the gate structure, the gate contact may be electrically isolated from a source-drain region in the semiconductor substrate by the isolation liner.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring of the presented embodiments.

As semiconductor devices shrink in each generation of semiconductor technology, formation of gate contacts, or CB contacts, may become more challenging because there is an increased risk of a short circuit between a source-drain region and a gate contact. The risk of a short circuit may be increased because of the reduction of the gate contact to source-drain region distance as a result of the continuous reduction in gate height. Over-etch of spacer material and gate contact misalignment may further increase the probabilities of shorts between the source-drain region and gate contact. As a result, the likelihood of the gate contact shorting to the source-drain region of a semiconductor structure increases in each generation, potentially having a significant impact on product yield and reliability.

A method of forming a semiconductor structure including an isolation liner to electrically separate a gate contact from an adjacent source-drain region is described in detail below by referring to the accompanying drawings in FIGS. 1-10, in accordance with an illustrative embodiment of the present disclosure. In typical self-aligned contact (SAC) techniques, a gate cap may be needed to enable the SAC process. The gate cap may include different types of nitrides which may have similar etch properties as the gate spacer. The gate contact may be formed on top of a gate structure but also may be on top of the gate spacers. Owing to the similar etch properties between the gate cap and the gate spacers, the gate spacers may be vertically eroded during formation of the contact hole. The erosion of the gate spacers may cause the gate contact to be displaced towards an adjacent source-drain region increasing the probability of a short circuit between the gate contact and the source-drain region. Accordingly, improving gate contact formation may enhance device performance and increase product yield and reliability.

According to an exemplary embodiment, gate contact formation may be improved by forming an isolation liner prior to the deposition of the gate cap. The isolation liner may be deposited on top of the gate structure and recessed gate spacers prior to the deposition of the gate cap; this may prevent vertical erosion of the gate spacers and may electrically isolate the gate contact from an adjacent source-drain region. One embodiment by which to fabricate the isolation liner to prevent vertical erosion of the gate spacers during contact hole formation and to isolate the gate contact from a source-drain region is described in detail below by referring to the accompanying drawings in FIGS. 1-10.

Figure 1:
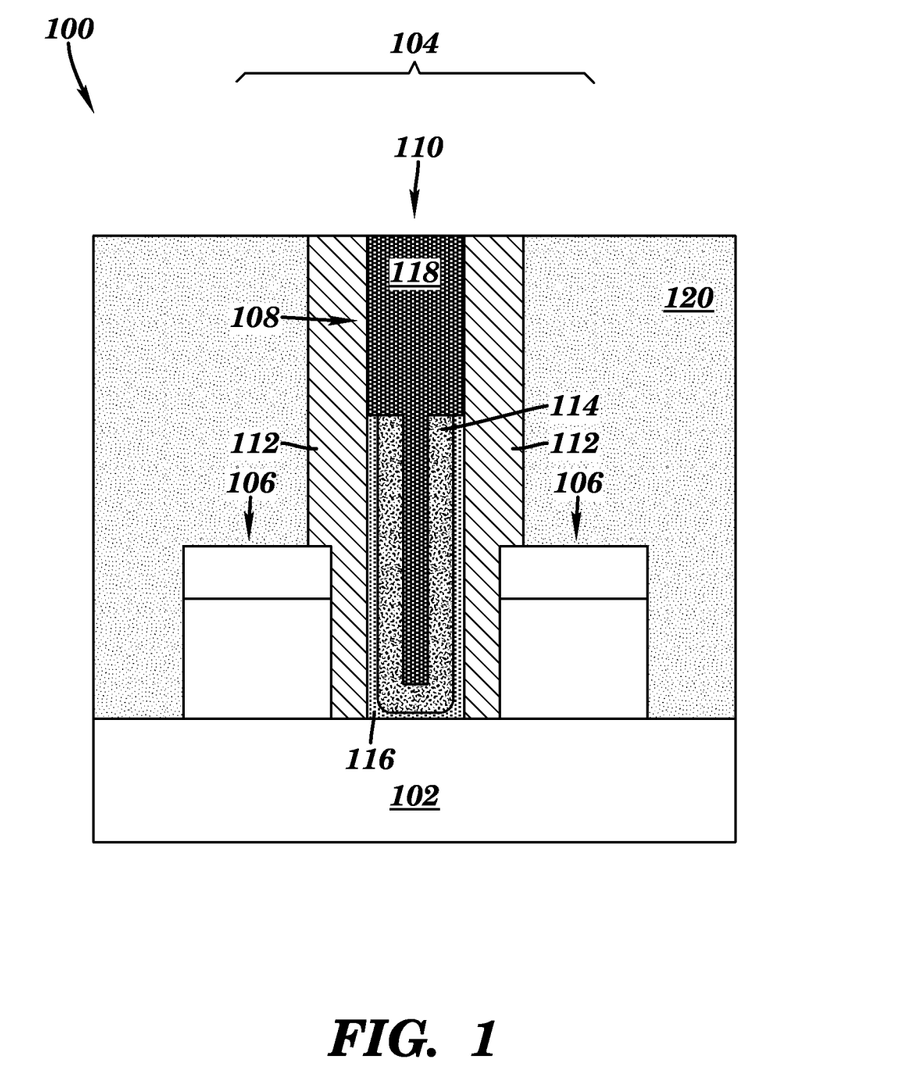
FIG. 1 is a cross-sectional view of a semiconductor structure depicting a FET device formed above a semiconductor substrate surrounded by a first ILD layer, according to an embodiment of the present disclosure.

Referring to FIG. 1, a semiconductor structure 100 may include a field effect transistor (FET) device 104 formed over a semiconductor substrate 102, and a first ILD layer 120 over the FET device 104. The FET device 104 may include an n-type FET device (n-FET) or a p-type FET device (p-FET).

The FET device 104 may include a gate structure 110. In one embodiment, the gate structure 110 may be formed above the semiconductor substrate 102. In another embodiment, the gate structure 110 may be formed over a portion of one or more fins (not shown) formed from the semiconductor substrate 102. It should be noted that the gate structure 110 may be formed in any semiconductor substrate known to a person having ordinary skill in the art, including but not limited to SOI substrates and bulk silicon substrates. It should be understood that the FET device 104 may be fabricated using either a replacement metal gate (RMG), or gate last, process flow, or a gate first process flow. A gate last process flow will be relied on for the description provided below.

At this point of the manufacturing process, the gate structure 110 may include a metal gate 108 formed by a plurality of metal layers and a gate dielectric layer. In one embodiment, the metal gate 108 may include a gate dielectric 116, a workfunction metal 114 and first conductive material (also referred to as a gate electrode) 118. In some embodiments, the gate structure 110 may include additional layers (not shown), for example, a second workfunction metal.

The gate dielectric 116 may include an insulating material including, but not limited to: oxide, nitride, oxynitride or silicate including metal silicates and nitrided metal silicates. In one embodiment, the gate dielectric 116 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 116 may vary, but typically the gate dielectric 116 may have a thickness ranging from about 0.5 nm to about 10 nm. More preferably the gate dielectric 116 may have a thickness ranging from about 0.5 nm to about 3 nm. The gate dielectric 116 may be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes.

The workfuction metal 114 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment, the first conductive material 118 may include a metal with lower resistivity (higher conductivity) than the workfunction metal 114, including, for example tungsten (W) or aluminum (Al). The workfunction metal 114 and the first conductive material 118 may be deposited by any suitable deposition technique known in the art, for example by ALD, CVD, physical vapor deposition (PVD), molecular beam deposition (MBD), pulsed laser deposition (PLD), or liquid source misted chemical deposition (LSMCD).

With continued reference to FIG. 1, source-drain regions 106 may be formed in the semiconductor substrate 102 adjacent to the gate structure 110. For the purposes of this disclosure, source-drain regions 106 formed in the semiconductor substrate may also include source-drain regions 106 formed on or above the semiconductor substrate 102, as depicted in FIG. 1. The steps involved in forming the source-drain regions 106 are well known to those skilled in the art. The source-drain regions 106 may include raised source-drain regions, extension regions, halo regions, and deep source-drain regions. In one embodiment, the source-drain region 106 may include a raised source-drain region (RSD), as depicted in FIG. 1. It should be noted that silicide (not shown) and/or local metal interconnects (not shown) may also be on top of the source-drain regions 106.

Gate spacers 112 may be formed on opposite sidewalls of the gate structure 110 by conventional deposition and etching techniques. In various embodiments, the gate spacers 112 may include one or more layers. While the gate spacers 112 are herein described in the plural, the gate spacers 112 may consist of a single spacer surrounding the gate structure 110. The gate spacers 112 may be made from an insulator material such as an oxide, nitride, oxynitride, silicon carbon oxynitride, silicon boron oxynitride, low-k dielectric, or any combination thereof. The gate spacers 112 may have a thickness ranging from approximately 5 nm to approximately 25 nm. In one embodiment, the gate spacers 112 may include silicon nitride and may be formed by depositing a conformal silicon nitride layer over the gate structure 110 and removing unwanted material from the conformal silicon nitride layer using an anisotropic etching process such as, for example, reactive ion etching (RIE) or plasma etching.

The first ILD layer 120 may be formed above the semiconductor substrate 102. The first ILD layer 120 may fill the gaps between two adjacent gate structures (not shown) and other existing devices within the semiconductor structure 100. The first ILD layer 120 may be formed by any suitable deposition method known in the art, for example, by CVD of a dielectric material. The first ILD layer 120 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The first dielectric layer 120 may be thinned, for example by a chemical mechanical planarization/polish (CMP) technique, so that a top surface of the first dielectric layer 120 may be approximately coplanar with a top surface of the gate structure 110. After CMP, the first dielectric layer 120 may have a thickness ranging from approximately 30 nm to approximately 120 nm.

Figure 2:
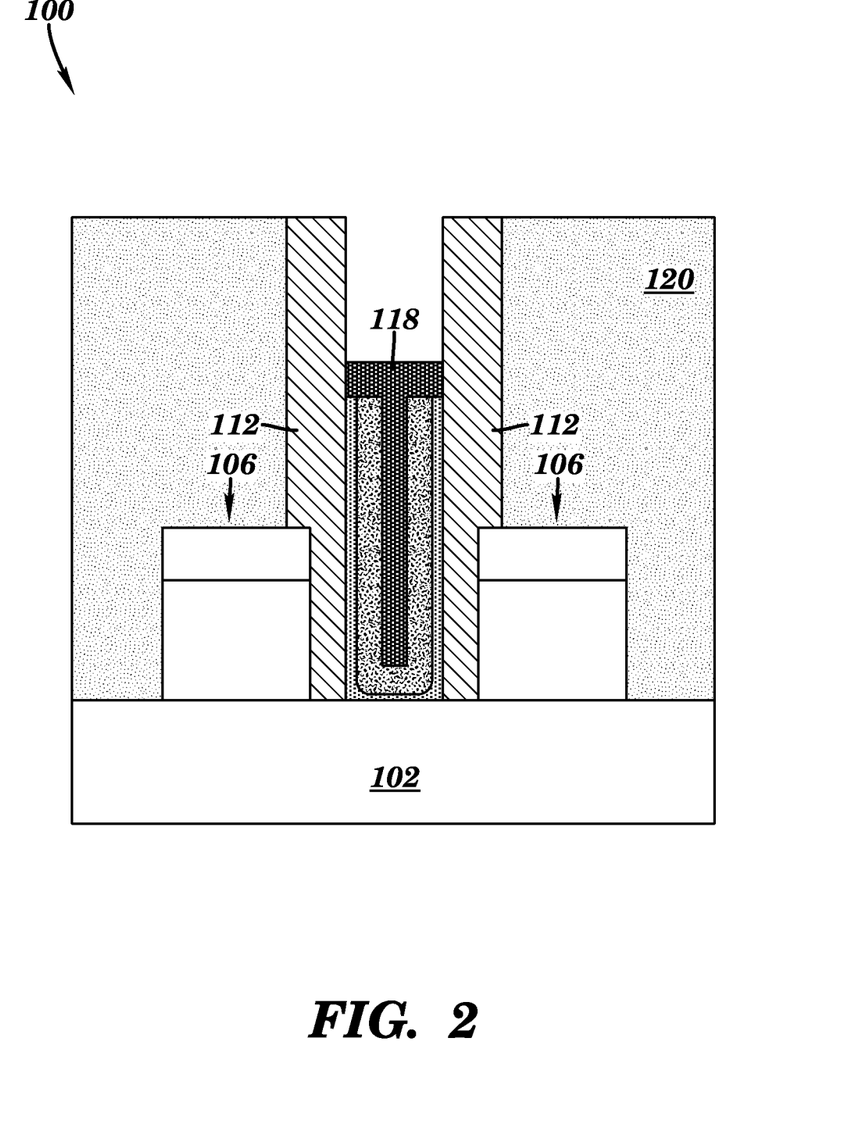
FIG. 2 is a cross-sectional view of a semiconductor structure depicting the etching of a first conductive material, according to an embodiment of the present disclosure.

Referring now to FIG. 2, the first conductive material 118 may be recessed selective to the gate spacers 112 and the first ILD layer 120. Ideal etch selectivity may result in a fast etch rate of the first conductive material 118, with little or no etching of all other materials. The first conductive material 118 may be recessed by any suitable isotropic etching technique known in the art, for example, by directional RIE.

Figure 3:
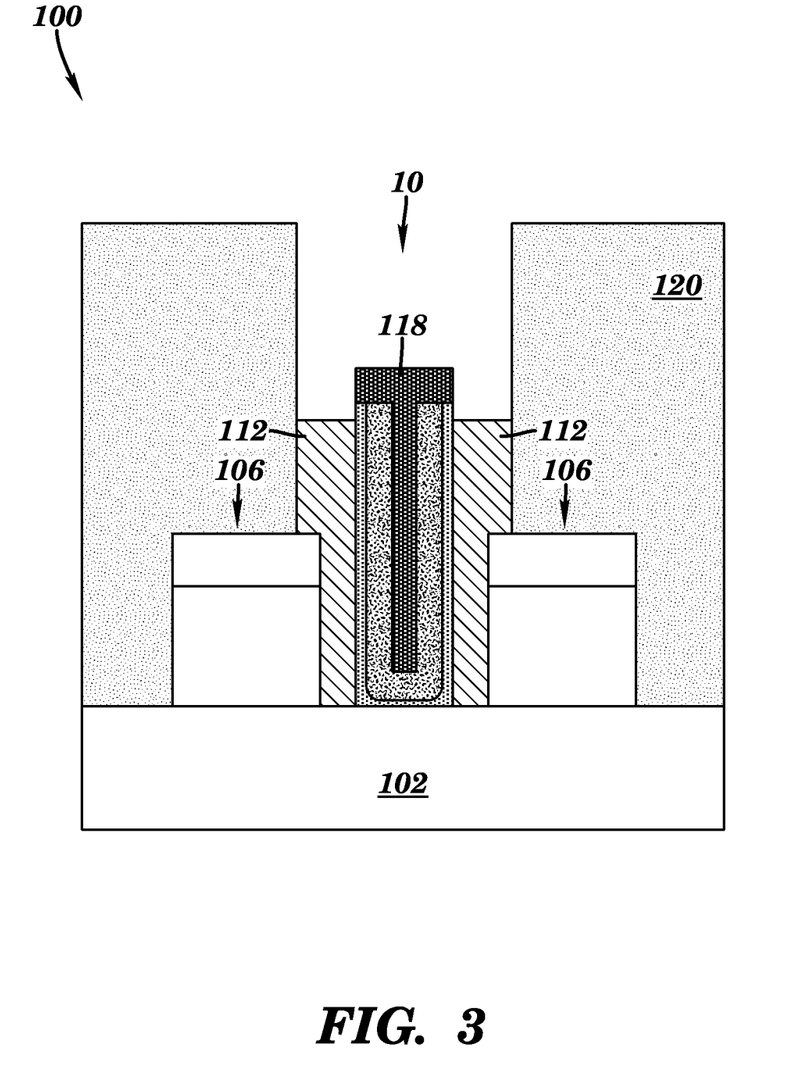
FIG. 3 is a cross-sectional view of a semiconductor structure depicting the etching of gate spacers, according to an embodiment of the present disclosure.

Referring now to FIG. 3, the gate spacers 112 may be recessed selective to the first ILD layer 120 and the first conductive material 118. The gate spacers 112 may be recessed by any suitable isotropic etching technique known in the art, such as for example, directional RIE. After recessing the gate spacers 112, a top portion of the first conductive material 118 may be exposed and a gate recess region 10 may be formed above the gate spacers 112 and the first conductive material 118. In one embodiment, etching of the gate spacers 112 may stop once a height of approximately 10 nm to approximately 30 nm of the first conductive material 118 is exposed.

Figure 4:
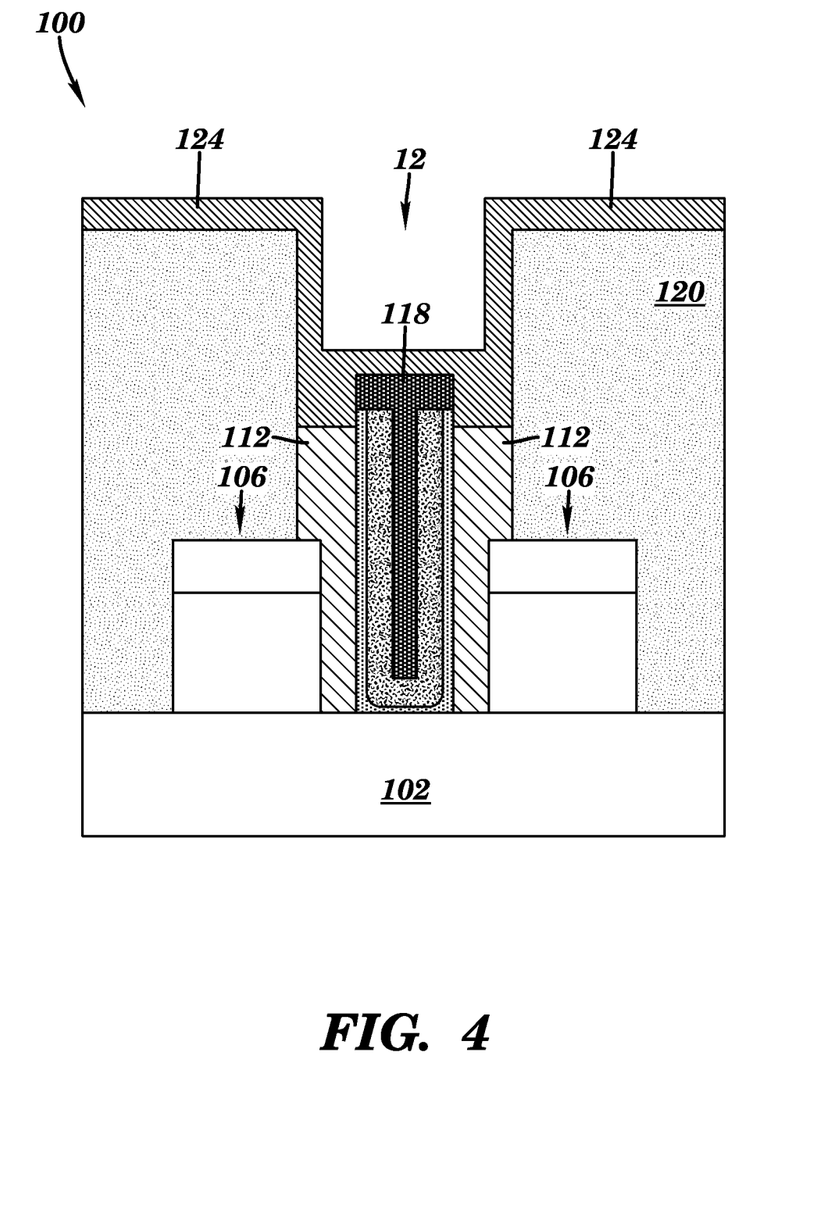
FIG. 4 is a cross-sectional view of a semiconductor structure depicting the deposition of an isolation liner, according to an embodiment of the present disclosure.
Figure 7:
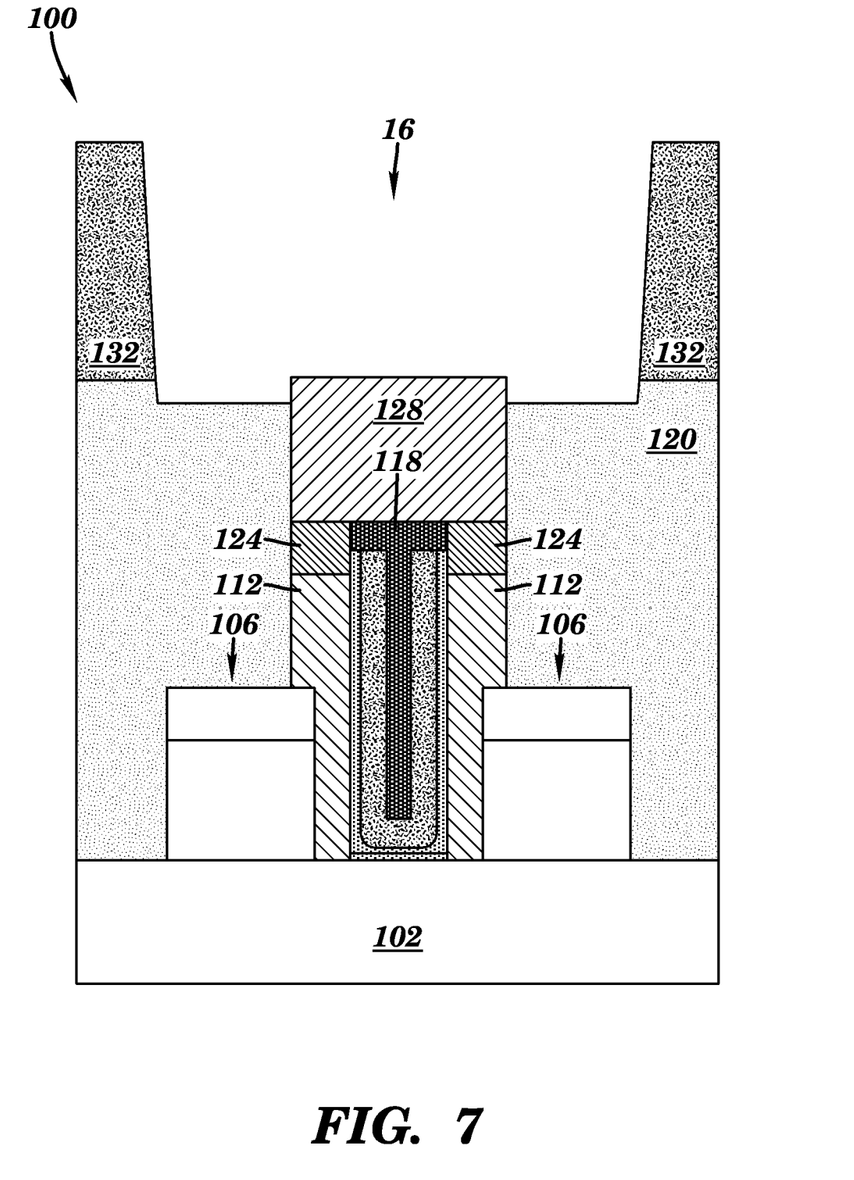
FIG. 7 is a cross-sectional view of a semiconductor structure depicting the formation of a recess in the first and second ILD layers, according to an embodiment of the present disclosure.
Figure 8:
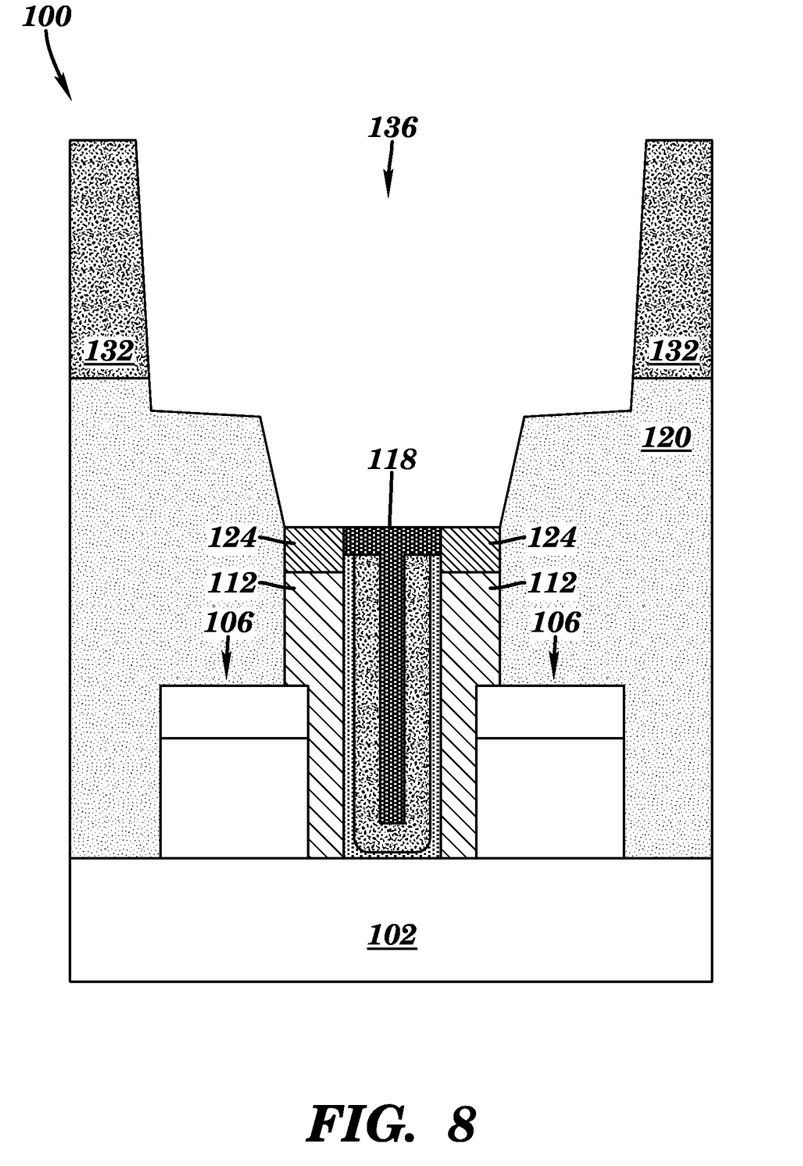
FIG. 8 is a cross-sectional view of a semiconductor structure depicting the removal of the gate cap and the formation of a contact hole, according to an embodiment of the present disclosure.

Referring now to FIG. 4, an isolation liner 124 may be deposited in the gate recess region 10 (shown in FIG. 3). The isolation liner 124 may function as an etch stop liner to prevent damage of the gate spacers 112 during contact hole formation (FIGS. 7-8). The isolation liner 124 may be formed by any deposition method know in the art, for example, by atomic layer deposition (ALD). The isolation liner 124 may be made of a material capable of etched selectively relative to a subsequently formed gate cap 128 (shown in FIG. 6) and the gate spacers 112. In one embodiment, the isolation liner 124 may include a high-k dielectric material, including, for example, transition metal oxides such as hafnium oxides ($Hf_yO_x$), lanthanum oxides ($La_yO_x$) and zirconium oxides ($Zr_yO_x$). Any other suitable dielectric material with suitable etch properties may also be used as the isolation liner 124, including for example, other ALD-deposited high-k oxides The isolation liner 124 may have a thickness ranging from approximately 3 nm to approximately 15 nm such that after deposition of the isolation liner 124, the space above the gate spacers 112 and between the first ILD layer 120 and an exposed portion of the first conductive material 118 may be substantially filled. Deposition of the isolation liner 124 may delineate an upper contour of the semiconductor structure 100 creating a first recess 12.

Figure 5:
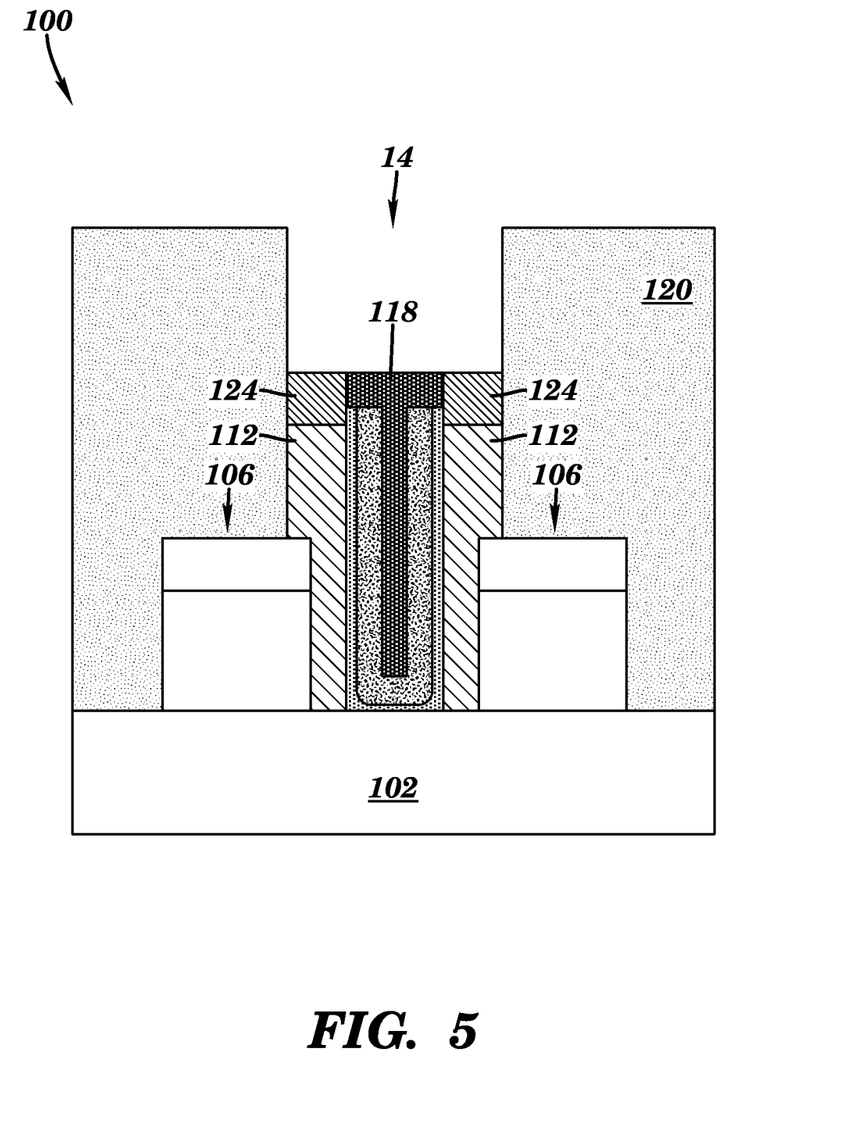
FIG. 5 is a cross-sectional view of a semiconductor structure depicting the removal of a portion of the isolation liner, according to an embodiment of the present disclosure.

Referring now to FIG. 5, the isolation liner 124 may be removed from an upper portion of the first ILD layer 120. By removing the isolation liner 124, the first recess 12 (FIG. 4) may be expanded until a top surface of the first conductive material 118 has been exposed and a remaining portion of the isolation liner 124 above the gate spacers 112 may be approximately coplanar with a top surface of the first conductive material 118. Alternatively, the remaining portion of the isolation liner 124 may be slightly lower than the top surface of the first conductive material 118. The isolation liner 124 may be removed by any suitable isotropic etching technique known in the art that may be selective to the first conductive material 118 and the ILD layer 120. In one embodiment where the isolation liner 124 may include hafnium oxide, for example, the isolation liner 124 may be removed by a high temperature plasma etch with a $BCl_3$ etchant. In another embodiment where the isolation liner 124 may include an oxide, for example, the isolation liner 124 may be removed by a chemical oxide removal (COR) technique. A portion of the isolation liner 124 may remain above the gate spacers 112 filling the space between the exposed portion of the first conductive material 118 and the first ILD layer 120. After removal of a portion of the isolation liner 124, a second recess 14 may be formed above the remaining portion of the isolation liner 124 and the first conductive material 118. It should be noted that the amount of etch back may be close to the initial deposition thickness of the isolation liner 124.

Figure 6:
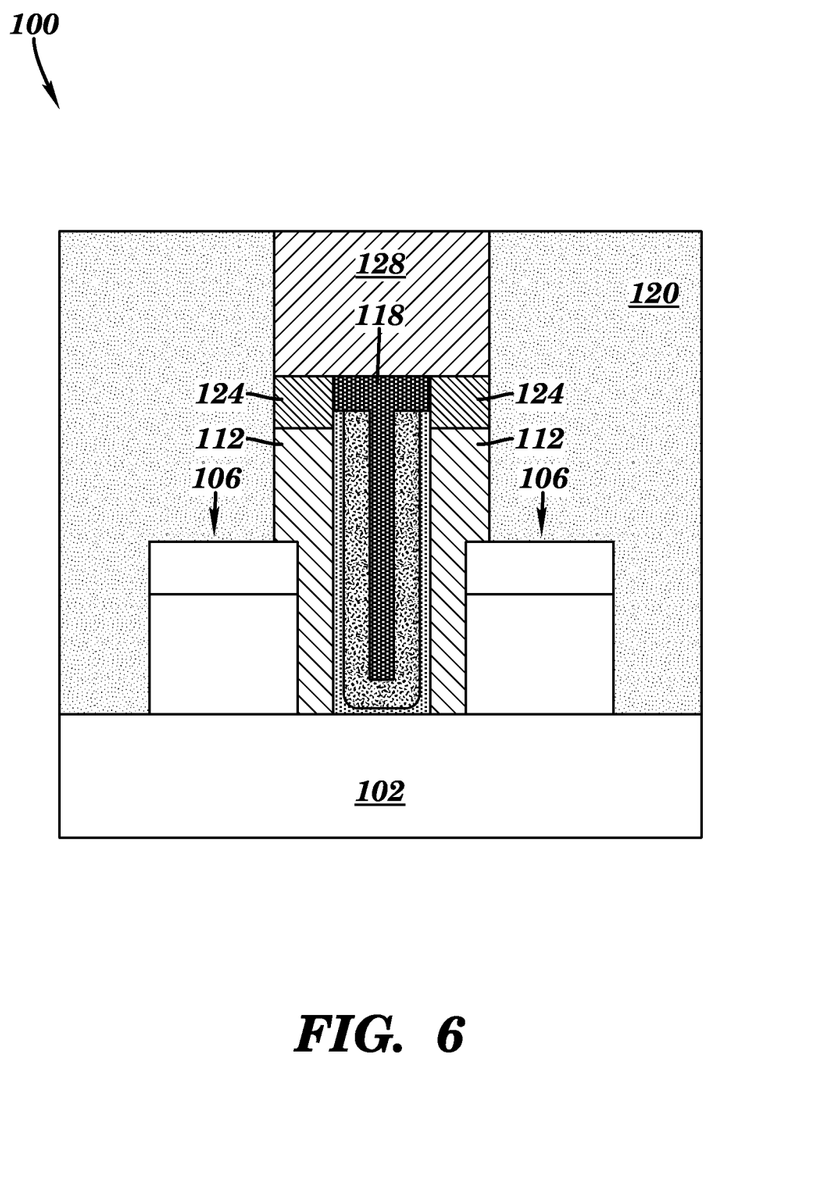
FIG. 6 is a cross-sectional view of a semiconductor structure depicting the deposition of a gate cap above the isolation liner and the first conductive material, according to an embodiment of the present disclosure.

Referring now to FIG. 6, a gate cap 128 may be formed above the isolation liner 124 substantially filling the second recess 14 (FIG. 5). The isolation liner 124 may prevent vertical erosion of gate spacers 112 during the subsequent formation of a contact hole 136 (FIG. 8). The gate cap 128 may be made of substantially the same material as the gate spacers 112. In one embodiment, the gate cap 128 may include silicon nitride and may have a thickness ranging from approximately 15 nm to approximately 45 nm. The gate cap 128 may be formed by any deposition method know in the art, for example, by CVD or ALD. A CMP process may be conducted to remove an excess of the nitride material forming the gate cap 128 from the semiconductor structure 100 such that an upper surface of the gate cap 128 may be substantially coplanar with an upper surface of the first ILD layer 120.

Referring now to FIG. 7, a second ILD layer 132 may be deposited above the first ILD layer 120 and above the gate cap 128. The second ILD layer 132 may be formed by any suitable deposition method known in the art, for example, by CVD of a dielectric material. The second ILD layer 132 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The second ILD layer 132 may be made of a substantially similar material as the first ILD layer 120. Accordingly, the second ILD layer 132 may not be distinguishable from the first ILD layer 120. The second ILD layer 132 may have a thickness ranging from approximately 10 nm to approximately 100 nm.

After deposition of the second ILD layer 132, a third recess 16 may be etched through the second ILD layer 132 and the first ILD layer 120 to expose the gate cap 128. A portion of the first and second ILD layers 120, 132 may be removed by any suitable etching technique known in the art, for example, by dry etch, wet etch, or combination of both to form the third recess 16. The etching technique may be selective to the gate cap 128. In one embodiment, a timed RIE technique may be used to etch the third recess 16 selectively to the gate cap 128.

Referring now to FIG. 8, the gate cap 128 (FIG. 7) may be removed to expose the first conductive material 118. The gate cap 128 may be removed by any suitable etching technique known in the art, for example, by dry etch, wet etch, or combination of both. Removal of the gate cap 128 may expand the third recess 16 (FIG. 7) to form a contact hole 136. The etching technique may be selective to the isolation liner 124 and the first conductive material 118. In one embodiment, a RIE technique may be used to remove the gate cap 128 selective to the isolation liner 124 and first conductive material 118.

The isolation liner 124 may function as a barrier during formation of the contact hole 136. If the isolation liner 124 were absent, the gate spacers 112 may be damaged by the etching technique used to form the contact hole 136, and therefore a short circuit may be caused between a subsequently formed gate contact (shown in FIG. 9) and an adjacent source-drain region 106.

Figure 9:
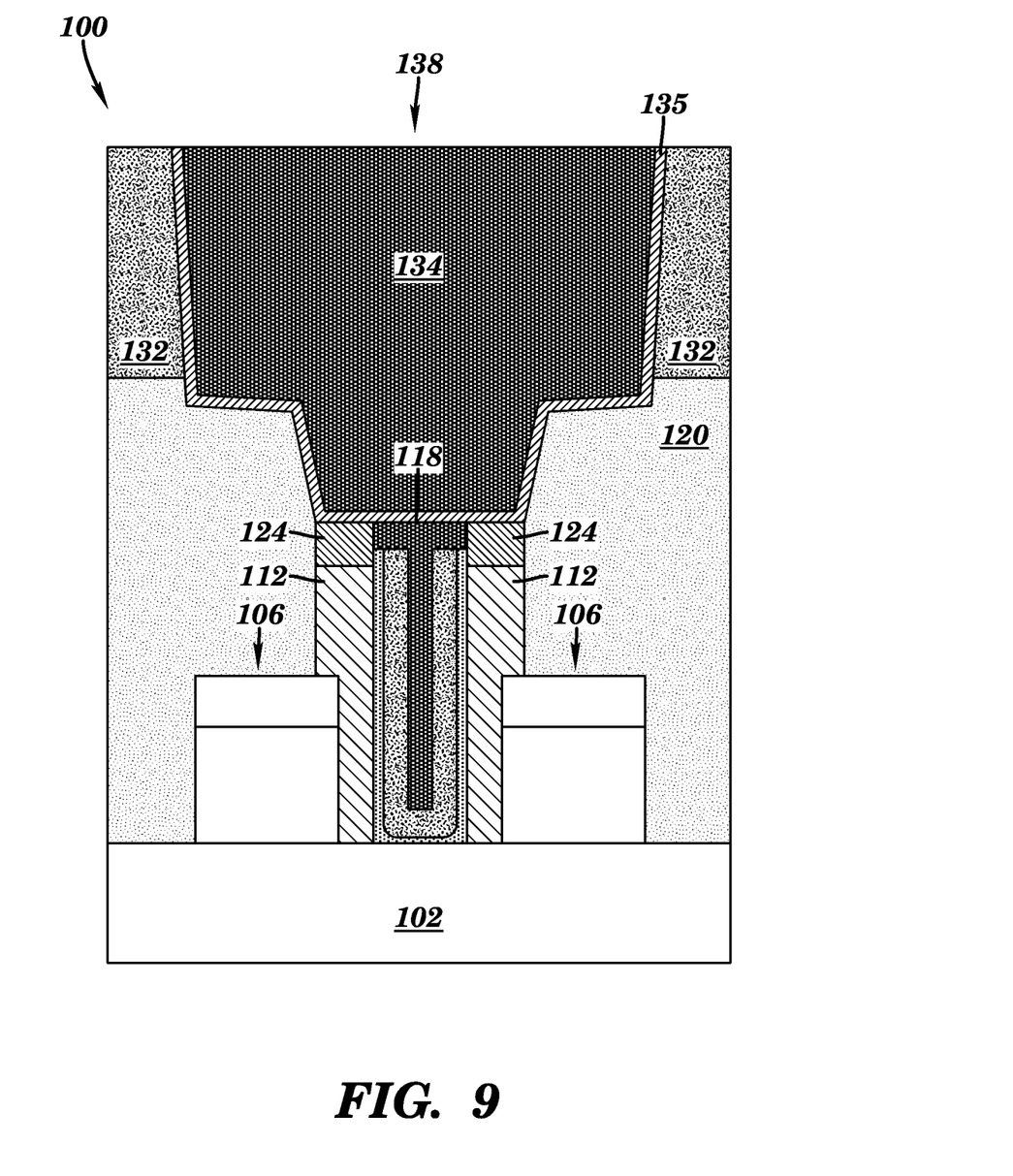
FIG. 9 is a cross-sectional view of a semiconductor structure depicting the deposition of a second conductive material to fill the contact hole and form a gate contact, according to an embodiment of the present disclosure.

Referring now to FIG. 9, a second conductive material 134 may be deposited to fill the contact hole 136 shown in FIG. 8 and form a gate contact 138 to the metal gate 108 (FIG. 1). The second conductive material 134 may include a material having a high electrical conductivity. In one embodiment, the second conductive material 134 may include, for example, tungsten, copper, aluminum, silver, gold, alloys thereof, and any suitable combination thereof. The thickness, or depth, of the second conductive material 134, may range from about 25 nm to about 150 nm, although lesser and greater thicknesses may also be used. In some embodiments, the second conductive material 134 may include several metal layers, seed layers, or liners of different materials; for example, the second conductive material 134 may include a metal liner 135. The metal liner 135 may include titanium (Ti) or titanium nitride (TiN).

The second conductive material 134 may be deposited by any suitable technique, such as, for example: ALD, molecular layer deposition (MLD), CVD, in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. After formation of the gate contact 138, a planarization process such as CMP may be performed to remove any excess second conductive material 134 from above the semiconductor structure 100.

Figure 10:
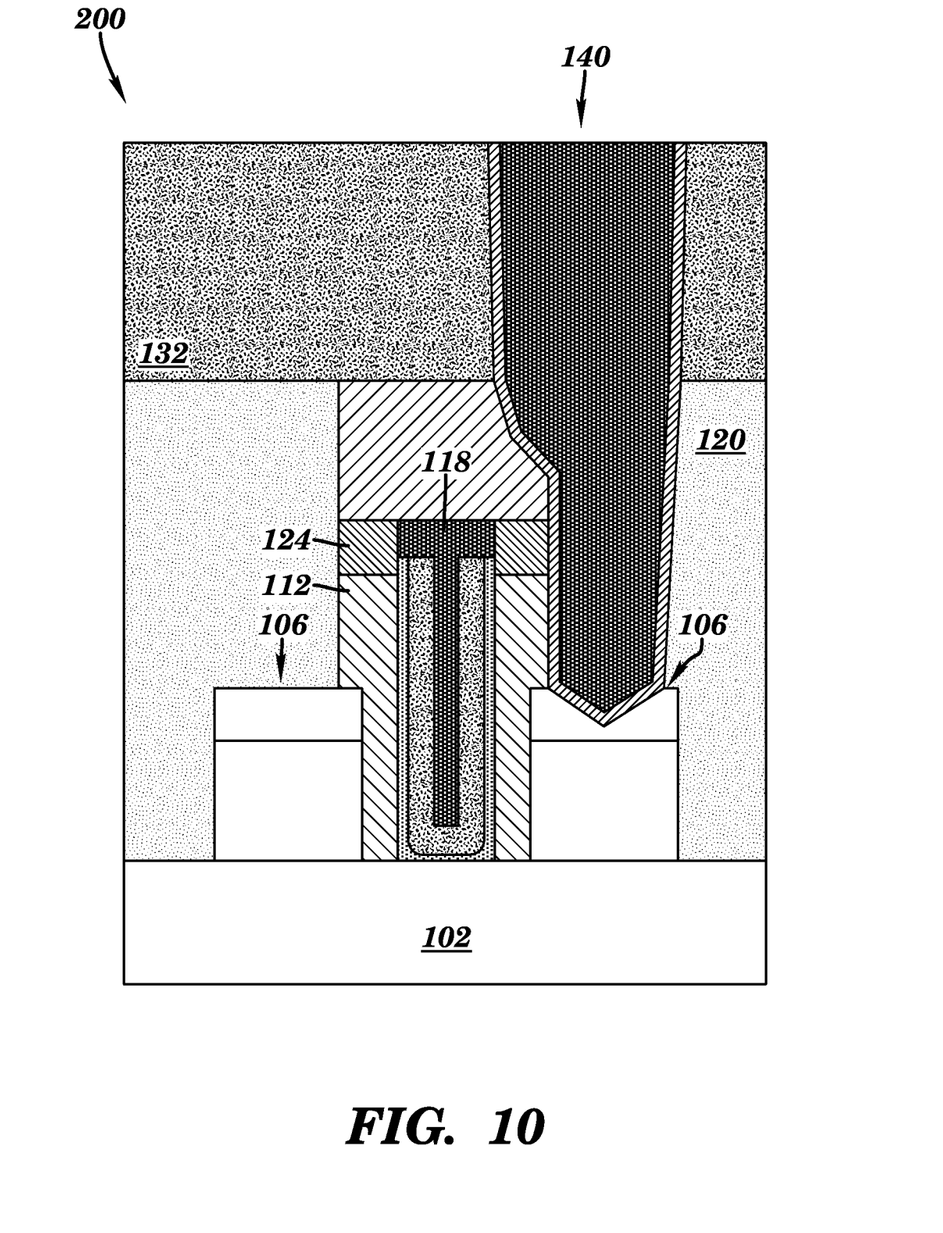
FIG. 10 is a cross-sectional view of a semiconductor structure depicting the formation of a source-drain contact, according to an alternate embodiment of the present disclosure.

Referring now to FIG. 10, a semiconductor structure 200 is shown to illustrate the formation of a source-drain contact 140 (also referred to as CA contact) to the source-drain region 106 in another FET device. As may be appreciated, the presence of the isolation liner 124 may not interfere with the formation of the source-drain contact 140.

Therefore, forming the isolation liner 124 prior to forming the gate cap 128 during fabrication of self-aligned contacts may have multiple advantages over known techniques in the art, including, but not limited to: the isolation liner 124 may electrically isolate the gate contact, or CB contact, from the adjacent source-drain regions 106, decreasing the possibilities of a short circuit in the device; the isolation liner 124 may serve as an effective barrier during etching of the contact hole 136 to form the gate contact 138, preventing vertical erosion of the gate spacers 112; and, because the isolation liner 124 may not need to be removed, an etching step may be eliminated, thus greatly reducing the possibility of causing further damage to the gate cap 128 and the gate spacers 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   gate spacers located on opposite sides of a gate structure on a semiconductor substrate, the gate structure having a height greater than a height of the gate spacers;
   an interlevel dielectric (ILD) layer located above the semiconductor substrate;
   an isolation liner located above the gate spacers, the isolation liner filling a space between a first conductive material of the gate structure and an exposed sidewall of the ILD layer; and
   a gate contact electrically connected to the gate structure, the gate contact vertically contacting the first conductive material of the gate structure and the isolation liner, wherein a top surface of the ILD layer is located above a top surface of the first conductive material of the gate structure and a top surface of the isolation liner.

2. The semiconductor structure of claim 1, wherein a top surface of the isolation liner is coplanar with a top surface of the first conductive material in the gate structure.

3. The semiconductor structure of claim 1, wherein a top surface of the isolation liner is located below a top surface of the first conductive material in the gate structure.

4. The semiconductor structure of claim 1, wherein the isolation liner comprises a high-k dielectric material selected from the group consisting of hafnium oxides, lanthanum oxides, and zirconium oxide.

5. The semiconductor structure of claim 1, wherein the gate spacers comprise silicon nitride, silicon carbon oxynitride, silicon boron oxynitride, or a low-k dielectric material.

6. The semiconductor structure of claim 1, wherein the first conductive material comprises tungsten or aluminum.

7. The semiconductor structure of claim 1, wherein the gate structure further comprises a gate dielectric and a work function metal present over the gate dielectric, wherein the first conductive material is present over the work function metal.

8. The semiconductor structure of claim 7, wherein the first conductive material is T-shaped having a lower portion surrounded by the work functional metal and an upper portion vertically contacting topmost surfaces of the gate dielectric and the work function metal.

9. The semiconductor structure of claim 7, wherein the gate dielectric comprises $SiO_2$, $HfO_2$, $ZrO_2$, $Al_2O_3$, $TiO_2$, $La_2O_3$, $SrTiO_3$, $LaAlO_3$, or a mixture thereof, and wherein the work function metal comprises Zr, W, Ta, Hf, Ti, Al, Ru, Pa, Ti3Al, ZrAl, TaC, TiC, or TaMgC.

10. The semiconductor structure of claim 1, further comprising another ILD layer located over the ILD layer, wherein the gate contact is laterally surrounded by an upper portion of the ILD layer and the another ILD layer.

11. The semiconductor structure of claim 10, wherein each of the ILD layer and the another ILD layer comprises silicon oxide, silicon nitride, hydrogenated silicon carbon oxide, a silicon based low-k dielectric material, a flowable oxide, a porous dielectric material, or an organic dielectric material.

12. The semiconductor structure of claim 1, further comprising source-drain regions present in the semiconductor substrate adjacent to the gate structure.

13. The semiconductor structure of claim 12, further comprising raised source-drain regions present over the source-drain regions, wherein the gate contact is electrically isolated from the raised source-drain regions by the isolation liner.

14. The semiconductor structure of claim 1, wherein the gate contact comprises a second conductive material.

15. The semiconductor structure of claim 14, wherein the second conductive material comprises tungsten, copper, aluminum, silver, gold, or an alloy thereof.

16. A semiconductor structure comprising:
gate spacers located on opposite sides of a gate structure on a semiconductor substrate, the gate structure having a height greater than a height of the gate spacers;
an interlevel dielectric (ILD) layer located above the semiconductor substrate;
an isolation liner located above the gate spacers, the isolation liner filling a space between a first conductive material of the gate structure and an exposed sidewall of the ILD layer, wherein a top surface of the isolation liner is located below a top surface of the first conductive material in the gate structure; and
a gate contact electrically connected to the gate structure, the gate contact vertically contacting the first conductive material of the gate structure and the isolation liner.

17. The semiconductor structure of claim 16, wherein a top surface of the ILD layer is located above a top surface of the first conductive material of the gate structure and a top surface of the isolation liner.

18. A semiconductor structure comprising:
gate spacers located on opposite sides of a gate structure on a semiconductor substrate, the gate structure having a height greater than a height of the gate spacers;
an interlevel dielectric (ILD) layer located above the semiconductor substrate;
an isolation liner located above the gate spacers, the isolation liner filling a space between a first conductive material of the gate structure and an exposed sidewall of the ILD layer;
a gate contact electrically connected to the gate structure, the gate contact vertically contacting the first conductive material of the gate structure and the isolation liner;
source-drain regions present in the semiconductor substrate adjacent to the gate structure; and
raised source-drain regions present over the source-drain regions, wherein the gate contact is electrically isolated from the raised source-drain regions by the isolation liner.

* * * * *